(12) United States Patent
Surendran

(10) Patent No.: US 10,489,538 B2
(45) Date of Patent: Nov. 26, 2019

(54) METHOD FOR COMPREHENSIVE INTEGRATION VERIFICATION OF MIXED-SIGNAL CIRCUITS

(71) Applicant: Texas Instruments Incorporated, Dallas, TX (US)

(72) Inventor: Sudhakar Surendran, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 505 days.

(21) Appl. No.: 15/333,457

(22) Filed: Oct. 25, 2016

(65) Prior Publication Data

US 2017/0124239 A1 May 4, 2017

(30) Foreign Application Priority Data

Oct. 30, 2015 (IN) .......................... 5867/CHE/2015

(51) Int. Cl.
*G06F 17/50* (2006.01)

(52) U.S. Cl.
CPC ........ *G06F 17/5036* (2013.01); *G06F 17/504* (2013.01); *G06F 17/5022* (2013.01)

(58) Field of Classification Search
USPC ....................................................... 716/106
See application file for complete search history.

(56) References Cited

U.S. PATENT DOCUMENTS

| 6,405,351 | B1 | 6/2002 | Steiss et al. |
| 7,275,223 | B2 | 9/2007 | Visvanathan et al. |
| 7,325,209 | B2 | 1/2008 | Mitra et al. |
| 7,890,914 | B2 | 2/2011 | Jensen |
| 8,112,652 | B2 | 2/2012 | Sajayan et al. |
| 2003/0149962 | A1* | 8/2003 | Willis .................. G06F 17/5027 717/135 |
| 2004/0158443 | A1 | 8/2004 | Rajanarayanan |
| 2006/0271904 | A1* | 11/2006 | Emerson .......... G01R 31/31704 716/111 |
| 2007/0079264 | A1 | 4/2007 | Goda et al. |
| 2007/0208548 | A1* | 9/2007 | McConaghy ....... G06F 17/5036 703/2 |
| 2009/0144674 | A1 | 6/2009 | Koithyar et al. |

(Continued)

OTHER PUBLICATIONS

Carsten Wegener, "Modeling static analog behavior for determining mixed-signal test coverage using digital tools", 20th International Mixed-Signal Testing Workshop (IMSTW), Jun. 24, 2016, 6 pages.

*Primary Examiner* — Mohammad Alam

(74) *Attorney, Agent, or Firm* — Ebby Abraham; Charles A. Brill; Frank D. Cimino

(57) ABSTRACT

Disclosed examples include methods for verifying mixed-signal circuit design, in which an executable specification file is generated including integration abstractions that represent an intended integration of ports and digital circuit blocks of the mixed-signal design, a formal properties file is automatically generated from the executable specification file, an analog circuit component of the mixed-signal circuit design is modeled as a digital circuit component in a model file, at least one analog circuit block of the mixed-signal circuit design is modeled as one or more ports in the model file, and correspondence of connections of the formal properties file and the model file is verified with the mixed-signal circuit design to generate a coverage report file.

18 Claims, 8 Drawing Sheets

(56) References Cited

U.S. PATENT DOCUMENTS

| | | |
|---|---|---|
| 2009/0187715 A1 | 7/2009 | Sajayan et al. |
| 2009/0193270 A1 | 7/2009 | Sajayan et al. |
| 2009/0249105 A1 | 10/2009 | Sajayan et al. |
| 2010/0031209 A1 | 2/2010 | Luan et al. |
| 2011/0054875 A1* | 3/2011 | Chang ................. G06F 17/5036 703/14 |
| 2011/0098990 A1 | 4/2011 | Fang et al. |
| 2013/0151225 A1 | 6/2013 | Kidambi |
| 2017/0124239 A1* | 5/2017 | Surendran ........... G06F 17/5036 |

* cited by examiner

| | C1 | C2 | C3 | C4 | C5 | C6 | C7 | C8 |
|---|---|---|---|---|---|---|---|---|
| | TOPBLOCK | LOGIC | COMMENTS | 406-2A<br>[IP2:iIP2_(A)] | 406-2B<br>[IP2:iIP2_(B)] | 406-2C<br>[IP2:iIP2_(C)] | 406-3<br>[IP3:iIP3] | 406-4<br>[IP4:iIP4] |
| R0 | | 420 [TOP] | | | | | | |
| R1 | [OUT2]<br>411 | 410 | OUT2 PORT AT CI0 LE | IN1 417 | | | TOP.I5 422 | |
| R2 | | $A(IBIAS5U[1]<2:0>) | | IBIAS5U<2:0> | IBIAS5U<2:0> | IBIAS5U<2:0> 424 | | |
| R3 | | $COND(SEL_I1<15> & !N_SEL<5>) | | SEL_INT<15> | | | | |
| R4 | | $IF(CONA<21> ? 4'b0 ? CONA<20:17>) | | CONFIG<7:4> | | | | |
| R5 | [VSS_TOP]<br>414 | 406-1 | FOR COVERAGE PURPOSES | VSSD/VSSA | VSSD/VSSA 416 | VSSD/VSSA | VSSD/VSSA | VSSD/VSSA |
| R6 | 404 | [$OPEN] 413 | | EXT_GAIN | EXT_GAIN | EXT_GAIN | | |

EXECUTABLE SPECIFICATION
400

702 — 
```
module RESISTOR (PLUS, MINUS);
inout   PLUS;
inout   MINUS;
    assign MINUS = PLUS;
endmodule
```

704 — 
```
module CAPACITOR (PLUS, MINUS);
inout   PLUS;
inout   MINUS;
    //Empty module
endmodule
```

706A — 
```
module NMOS (D,G,S);
inout   D;
input   G;
inout   S;
    assign D = (G & ~S)? S : 1'bz;
endmodule
```

706B — 
```
module PMOS (D,G,SUB,S);
inout   D;
input   G;
input   SUB;
inout   S;
    assign D = (~G & S & ~SUB)? S: 1'bz;
endmodule
```

708 — 
```
module SWITCH (INP,OUT,SEL,SELZ,);
input   INP;
output  OUT;
input   SEL;
input   SELZ;
    assign OUT = (SEL & ~SELZ)? INP : 1'bz;
endmodule
```

METHOD FOR COMPREHENSIVE INTEGRATION VERIFICATION OF MIXED-SIGNAL CIRCUITS

REFERENCE TO RELATED APPLICATION

This application claims priority to, and the benefit of, Indian provisional application number 5867/CHE/2015, entitled "METHOD FOR COMPREHENSIVE INTEGRATION VERIFICATION OF MIXED-SIGNAL CIRCUITS", and filed in India on Oct. 30, 2015, the entirety of which is hereby incorporated by reference.

BACKGROUND

Mixed-signal circuits typically include both analog and digital circuit blocks, as well as ports for internal interconnections external connections. Modern circuit design often involves electronic design automation (EDA) tools to simulate and verify circuit block operation and interconnections. However, most EDA tools do not provide for time efficient verification of mixed-signal design integration. In particular, mixed-signal integration verification is a time consuming task that often involves verifying thousands of connections and associated control logic. Conventional simulation can be used to verify the mixed-signal integration, but this involves excessive time for comprehensive verification. The simulation time can be reduced by reducing the scope of verification, but this increases the chances of incorrect designs being approved for production.

SUMMARY

Disclosed examples include methods for verifying mixed-signal circuit design, in which an executable specification file is generated including integration abstractions that represent an intended integration of ports, pins of digital and analog circuit blocks of a mixed-signal design, a formal properties file is automatically generated from the executable specification file, an analog circuit component of the mixed-signal circuit design is modeled as a digital circuit component in a model file, at least one analog circuit block of the mixed-signal circuit design is modeled as one or more ports in the model file, and correspondence of connections of the formal properties file and the model file is verified with the mixed-signal circuit design to generate a coverage report file.

BRIEF DESCRIPTION OF THE DRAWINGS

FIG. 4 shows an example executable specification file corresponding to the mixed-signal circuit design example of FIG. 2.

FIGS. 7 and 8 show an example of modeling analog circuit components of a mixed-signal circuit design in the integration verification method of FIG. 1.

DETAILED DESCRIPTION

Figures 1, 10:
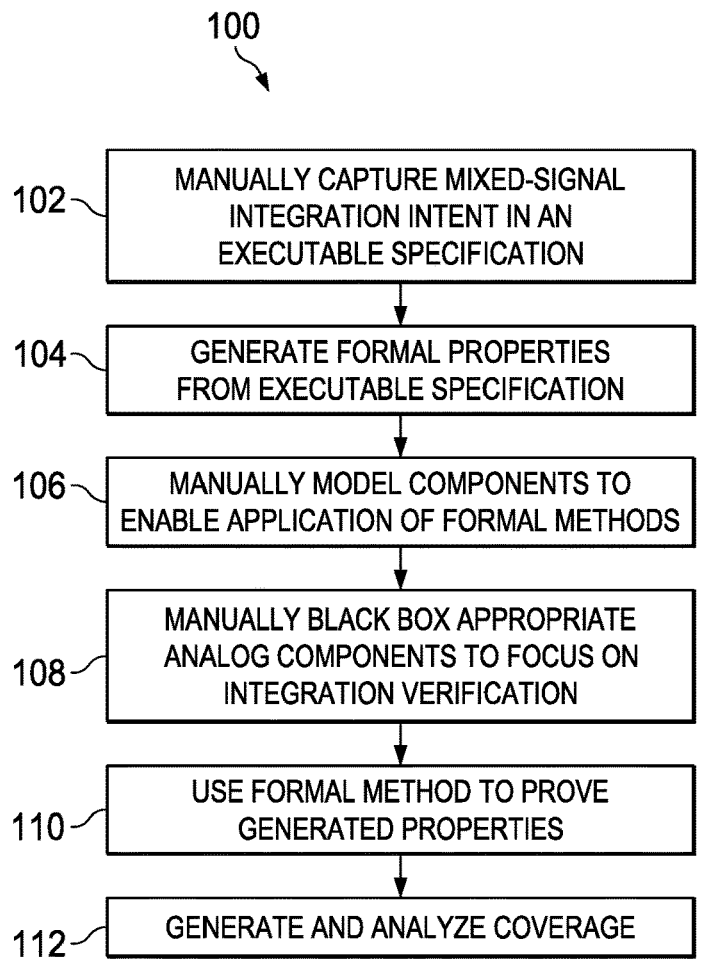
FIG. 1 is a flow diagram showing a method to verify integration of a mixed-signal circuit design according to an embodiment of the disclosure.
FIG. 10 shows an example coverage report generated in the integration verification method of FIG. 1.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Disclosed examples include methods and techniques to verify integration of mixed-signal circuit designs that include abstraction of the design intent and implementation details and generation of formal properties for formal proof. The disclosed methods can be used in conjunction with commercial EDA tools and systems for formal proof of a given mixed-signal circuit design. In certain examples, a user is provided with a netlist file defining a mixed-signal circuit design, and manually performs certain steps using Verilog or other properties language to construct or generate an executable specification file in a row and column format, such as a spreadsheet, that captures the mixed-signal integration intent. Software is used to automatically generate a formal properties file from the executable spec, and the user generates one or more model files to model or represent analog components to enable application of formal proof methods. EDA tools can then be used to prove the properties according to a mixed-signal netlist, the formal properties file and the model files, and the user can analyze coverage using formal methods.

Referring initially to FIGS. 1-4, FIG. 1 shows a method 100 to verify integration of a mixed-signal circuit design according to an embodiment of the disclosure. The method 100 can be used in verifying integration of any mixed-signal design, and is described hereinafter in association with the example mixed-signal circuit design 200 of FIG. 2. The method 100 in one example begins with a netlist file or other design definition representing ports 202, one or more analog circuit blocks 206 and one or more digital circuit blocks 204 or 208 of a mixed-signal circuit design 200.

Figure 2:
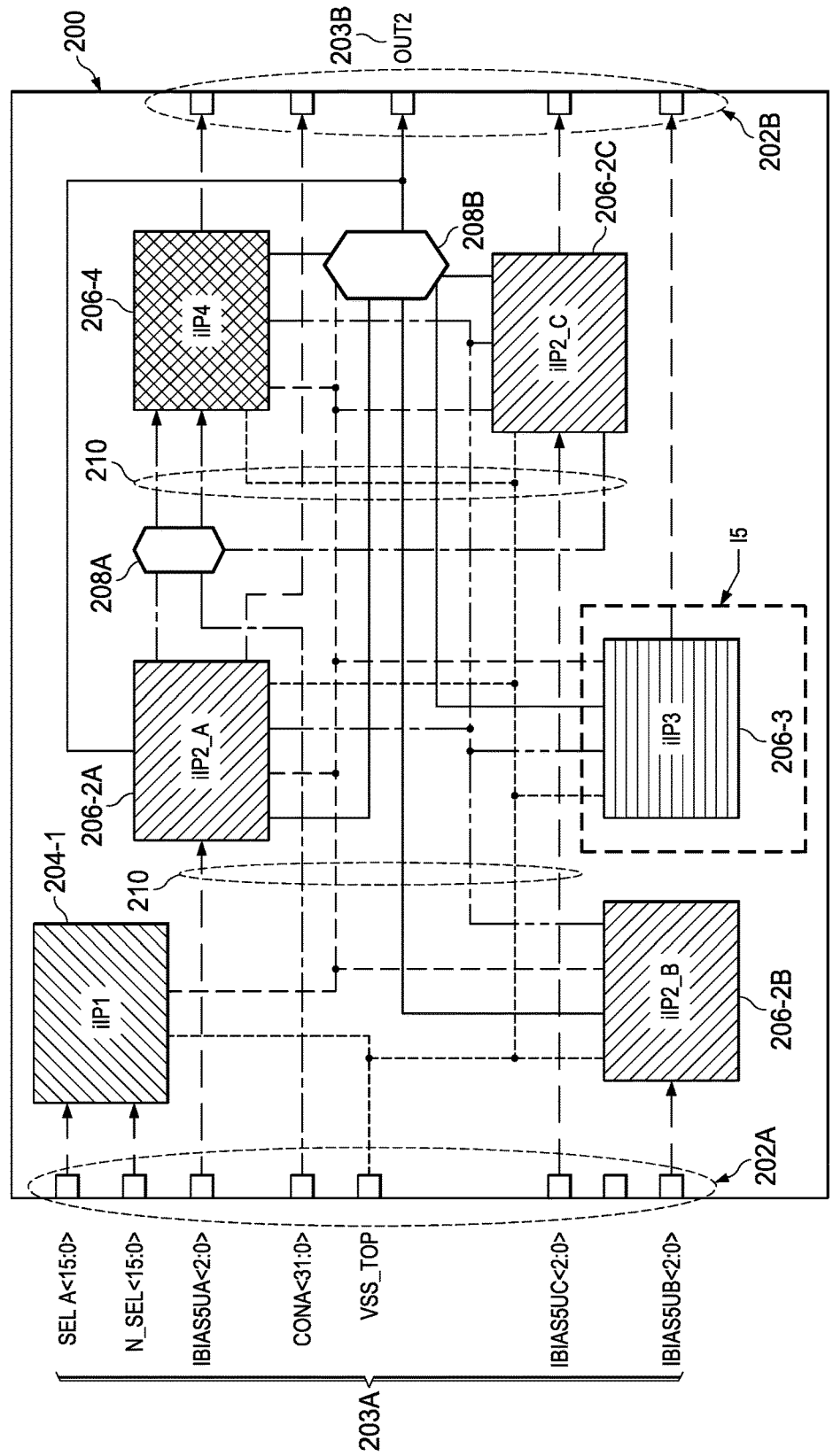
FIG. 2 is a schematic diagram of an example mixed-signal circuit design.

The example circuit design 200 of FIG. 2 includes externally accessible input and output ports or connections 202A and 202B, with corresponding port names or labels 203A and 203B shown in the drawing. The design 200 also includes several circuit blocks 204, 206 and 208 (also referred to as sub-blocks) labeled as "IPs" in FIG. 2. A first digital circuit block 204-1 is a control logic circuit block (labeled iIP1), and further digital and analog (mixed-signal) circuit blocks 208A and 208B are glue logic circuits operating on signals conveyed via port lines 202 (collectively referred to as ports) and interconnections 210 of the design. As used herein, ports can be externally accessible and/or ports of internal circuit blocks 204, 206 and/or 208. The example design 200 also includes analog circuit blocks 206, for example, programmable gain amplifier (PGA) circuits, other types of amplifier circuits, bandgap or other reference circuits, low dropout (LDO) regulator circuits, analog-to-digital converter (ADC) circuits, digital-to-analog converter (DAC) circuits, or so forth. The example 200 of FIG. 2 includes three instances of a first example analog circuit block, labeled as iIP2_A (206-2A), iIP2_B (206-2B) and iIP2_C (206-2C), as well as single instances of further analog circuit blocks I5 and iIP4 (206-4). The example 200 of FIG. 2 also includes an instance of analog circuit block labeled iIP3 (206-3) which is instantiated inside the analog circuit I5. I5 may have additional digital and analog circuits other than iIP3. FIG. 2 shows example names 203 for the input and output ports 202 of the design 200. The input port names 203A include a first 16 line bus name SEL_A<15:0>, a second 16 line bus name N_SEL<15:0>, a 32 line bus name CONA<31:0>, and a power port is named VSS_TOP which includes digital and analog power connections VSSD and VSSA. The input port names 203A also provide for three 3-line buses corresponding to the three instances of iIP2, respectively named IBIAS5UA<2:0>, IBIAS5UB<2:0> and IBIAS5UC<2:0>. In this example, a single output port name 203B is provided for an output line OUT2 of the output ports 202B.

The method 100 in FIG. 1 includes generating an executable specification file at 102, for example, based on an input netlist file (not shown) or other definition of the mixed-signal circuit design 200. In certain examples, the design 200 includes definitions of a desired ports 202, interconnections 210, and circuit blocks 204, 206 and/or 208 as shown in FIG. 2. FIG. 4 shows an example executable specification file 400 that includes integration abstractions 402 that represent an intended integration of ports 202 and digital circuit blocks 208 of the mixed-signal design 200. At 104, the method 100 includes automatically generating a formal properties file (e.g., file 600 in FIG. 6 below) from the executable specification file 400 using a processor executed software program. One or more analog circuit components are modeled at 106 as a digital circuit component in a model file (not shown) for verification using an electronic design automation EDA tool, and at least one analog circuit block 206 of the mixed-signal circuit design 200 is modeled at 108 as one or more ports in the model file. The method 100 further includes verifying correspondence of connections of the formal properties file 600 and the model file with the mixed-signal circuit design 200 at 110 using a processor executing an electronic design automation EDA tool to generate a coverage report file 1000 (e.g., FIG. 10 below). In one example, the correspondence is verified at 110 by comparing the connections of the netlist file with the formal properties file 600 and the model file(s). At 112, a user analyzes the coverage report file 1000 to determine the amount of coverage of the mixed-signal circuit design verification.

Figure 3:
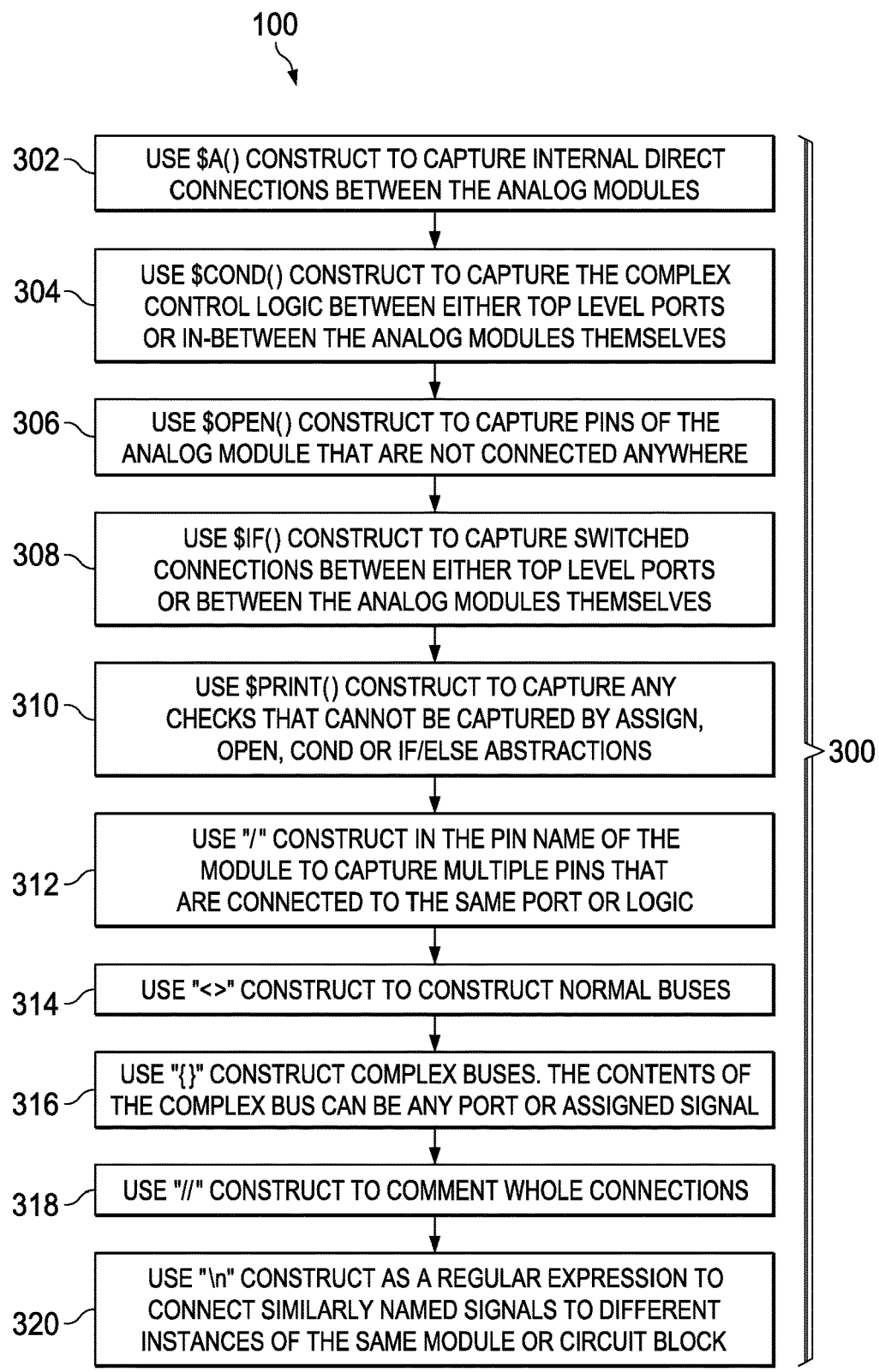
FIG. 3 is a flow diagram showing an example method of generating an executable specification file in the integration verification method of FIG. 1 according to an embodiment of the disclosure.

FIG. 3 shows details of an example method 300 to generate the executable specification file 400 (FIG. 4) that can be used at 102 in the method 100 of FIG. 1. In one example, a user manually generates the executable specification file 400, which includes a plurality of integration abstractions 402 that represent an intended integration of ports 202 and digital circuit blocks 208 of the mixed-signal design 200. In one example, the mixed-signal design 200 is represented as a netlist file, and the executable specification file 400 is generated at 102 according to the netlist file. In one implementation, the user can employ one or more abstractions referred to herein as COND, ASSIGN, OPEN, IF/ELSE and PRINT abstractions to capture the integration intent of the mixed-signal design 200 in a column and row format (e.g., by creating a spreadsheet file with Verilog or other language that can be processed by a formal EDA tool.

The example of FIG. 4 provides a specific format of an executable specification file 400 for capturing the integration intent that is easy to fill and review, with the capability to capture direct connections, complex control logic (digital and analog), switches, bus splits and direct printing. The process 300 in FIG. 3 is described below in conjunctions with the column and row format of FIG. 4. Other formats can be used in other implementations, for example, extended markup language (XML). In the example of FIG. 4, the executable specification file 400 includes C1-C8, and seven example rows R0-R6 are illustrated in the drawing. The first column C1 is labeled "TOPBLOCK" in FIG. 4 and includes names 404 of externally accessible ports 202 of the design 200. In the illustrated example, row R1 includes an entry "OUT2" designating the name 203B of the output port 202B in FIG. 2, and row R5 includes an entry in the first column C1 for the digital and analog supply port VSS_TOP. A second column C2 includes entries 406-1 and abstractions using corresponding constructs 410-414 corresponding to the control logic circuit block 204-1 and for open (e.g., unconnected) ports in the mixed-signal circuit design 200. The third column C3 in this example includes comments provided by the user. The remaining columns C4, C5, C6, C7 and C8 are used for representing abstractions of the remaining circuit blocks 206. Columns 4-6 include labels 406-2A (IP2:iIP2_(A)), 406-2B (IP2:iIP2_(B)) and 406-2C (IP2:iIP2_(C)) for the three instances 206-2A, 206-2B and 206-2C of iIP2 in FIG. 2. The seventh column C7 in the executable specification file 400 includes a label 406-3 (IP3:iIP3) corresponding to the circuit block 206-3, and the final column C8 includes a label 406-4 (IP4:iIP4) corresponding to the circuit block 206-4 in the mixed-signal circuit design 200. The rows R2-R6 define interconnections between the circuit blocks of the design 200, and each match between entries in a given row indicates a connection within the design 200. The row R0 captures the root hierarchical path of each of the analog blocks in the design. The common root path is given in column C2 (in the example shown the common root path is TOP 420). If the module has a root path that is different than one given in column C2, then it is given in the modules respective column. In the example module IP3s instance iIP3's root path is TOP.I5 which is different than TOP and hence it is given in its column 422.

The user can introduce or add one or more abstractions or constructs to the executable specification file 400 according to a particular mixed-signal circuit design integration intent at 102 in FIG. 1. FIG. 3 shows a detailed flow diagram of a process 300 by which the user captures the integration intent in the executable specification file 400. At 302 in FIG. 3, the user adds a first construct $A (e.g., 411 in FIG. 4) to the executable specification file 400 to represent internal direct connections of the mixed-signal design 200. The $A( ) construct 411 is used to capture an ASSIGN abstraction in the executable specification file 400 for internal direct connections between the analog circuit blocks. Direct connections with the top level ports 202 are captured in this example by the user including the port name in a different position without having to use the $A construct 411. The name given in the $A( ) construct is a new name for the internal assignment. In the example of FIG. 4, the abstraction $A(IBIAS5U\1<2:0.) In row R2 corresponds with the entries IBIAS5UA<2:0>, IBIAS5UB<2:0> and IBIAS5UC<2:0> in columns C4-C6 of the same row, and a "\" construct 410 in this case indicates that the three lines of IBIAS5UA<2:0> are internally connected to the first instance of iIP2_A, the three lines of IBIAS5UB<2:0> are internally connected to the first instance of iIP2_C, and the three lines of IBIAS5UC<2:0> are internally connected to the first instance of iIP2_C. This example further illustrates the construct "< >" described further below.

At 304 in FIG. 3, the user adds a second construct 412, $COND and at least one logic expression to the executable specification file 400 to represent a control logic circuit block 204 of the mixed-signal design 200. The $COND( ) construct 412 is used to capture complex control and mixed-signal logic between either top level ports 202 and/or between the analog circuit blocks 204, 206 themselves. In certain examples, the control logic abstraction 406-1 in the executable specification file 400 can include any expression used in Verilog (or other languages readable by EDA tools). In the example of FIG. 4, the user adds the construct 412 in row R3 with the expression for connection of the 16 line buses SEL_A<15:0> and N_SEL<15:0> to the first instance of iIP2_A circuit block 206-2A via the control logic circuit block 204-1 that is captured by the abstraction 406-1 in the executable specification file 400.

At 306 in FIG. 3, the user adds a third construct 413 ($OPEN) to the executable specification file 400 to represent unconnected external ports of the mixed-signal circuit design 200. For example, the user adds the construct 413 in row R6 of the specification file 400 of FIG. 4 to indicate that external gain (EXT_GAIN) ports or connections of the three instances of the analog circuit block iIP2_A (206-2A), iIP2_B (206-2B) and iIP2_C (206-2C) are not intended to be connected anywhere within the integrated mixed-signal circuit design 200.

At 308 in FIG. 3, the user adds a fourth construct 414 ($IF) to the executable specification file 400 to represent a switched connection of the mixed-signal design 200. The $IF( ) construct allows the user to capture the IF/ELSE abstraction for switched connections between either top level ports and/or between the circuit blocks themselves. In one example, the user adds the $IF( ) construct in situations where there is no "ELSE" portion. In the illustrated example, the user adds the construct $IF( ) in the second column C2 of row R4 including an expression CONA<21>? (4'b0? CONA<20:17>) representing logic of the abstracted control logic circuit block 204-1 in FIG. 2 for a connection of CONFIG<7:4> to the circuit block 206-2A shown in row R4 of the column C4.

At 310, the user adds a fifth construct $PRINT to the executable specification file 400 (not shown in the example of FIG. 4). The $PRINT construct can be used to represent elements of the mixed-signal design 200 that cannot be represented by any of the first, second, third or fourth constructs or abstractions ASSIGN, OPEN, COND or IF/ELSE abstractions. The content in PRINT abstraction in one example is directly dumped in to the formal properties file.

At 312, the user adds a sixth construct 416 ("/") to the executable specification file 400 to represent multiple connections to a single port 202, or multiple connections to a single circuit block 204, 206, 208 of the mixed-signal circuit design 200. The "/" construct 416 in the port or connection name of the design 200 captures multiple ports or connections that are connected to the same port or logic. For example, the use of the construct 416 in the entries VSS/VSS in columns C4-C8 in row R5 of FIG. 4 indicates two connections: (1) VSS_TOP to an analog supply VSSA and (2) VSS_TOP to a digital supply VSSD. At 314, the user adds a seventh construct 417 ("< >") to the executable specification file 400 to represent a normal bus of the mixed-signal design 200. The user may also add an eighth construct "{ }" (not shown in the example of FIG. 4) at 316 in FIG. 3 to represent a complex bus of the mixed-signal design 200. For example, the user in FIG. 4 adds the "< >" constructs 416 in row R2 for the bias current bus signal connections IBIAS5U<2:0>. In certain examples, the user can construct a complex bus using the "{ }" construct, where the contents of the complex bus can be any port or assigned signal such as {IBIAS5UA<2>, INSEL<5>, CONFIG<31: 15>}. Complex buses are given in the logic section (column C2 in executable file 400). At 318, the user adds a ninth construct "//" to the executable specification file 400 to comment connections in the entire row of the executable specification by adding the same first column C1 for the corresponding row. If details are added for a particular connection they can be added in the comment section (column C3 in executable file 400) without having to comment the entire connection.

Regular expression is used in certain examples to connect similarly named signals to different instances of the same module. For example, the module IP2 has three instances in FIG. 4, each connected to bit IBIAS5U<2:0>. For the instance iIP2_A of this module user, the designer has connected this to port IBIAS5UA<2:0>, for instance iIP2_B to IBIAS5UB<2:0>, and for instance iIP2_C to IBIAS5UC<2: 0>. This connection is presented as IBIAS5U\1<2:0> in the abstraction 406-1 of FIG. 4, where "\1" is used to indicate the instance name replacement. The replacement for the name comes from the value given in the braces after the analog IP module name e.g., "IP2:iIP2_(A)" and "IP2:iIP2_ (B)". If complex naming is used for the instance with multiple sub-sections they are also handled by using name replacement positions up to "\n" where "n" is the number of sub-sections. For example, if instance name is IA_1 and IB_2 and the ports are named as IBIAS5UA1 and IBIAS5UB2 then the ports are captured in the executable specification as IBIAS5U\1\2<2:0> and instance name is captured as "IP2:I(A)_(1)" and "IP2:I(B)_(2)".

Figure 5:
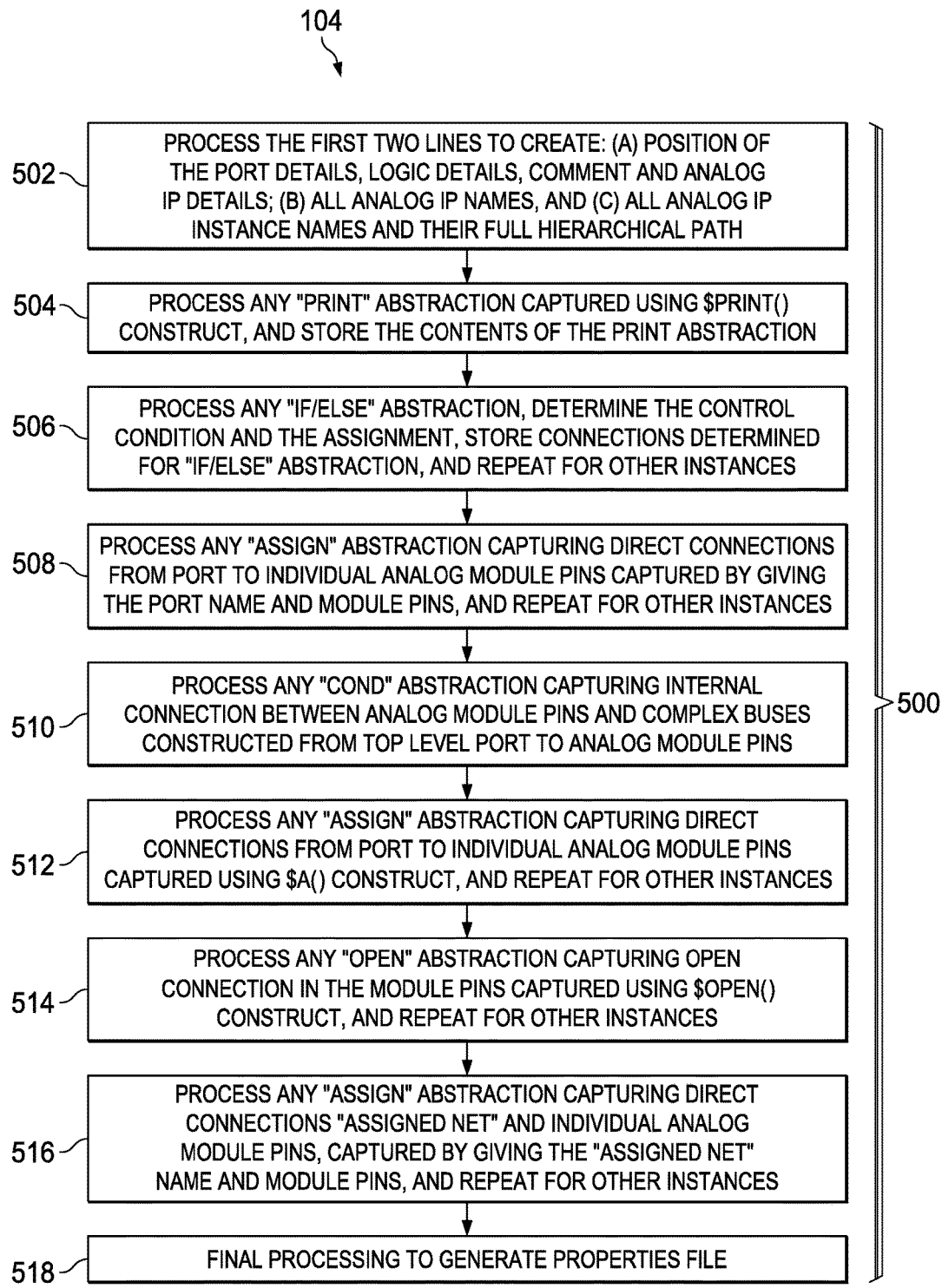
FIG. 5 is a flow diagram showing an example method of modeling analog circuit components of a mixed-signal circuit design in the integration verification method of FIG. 1 according to an embodiment of the disclosure.
Figure 6:
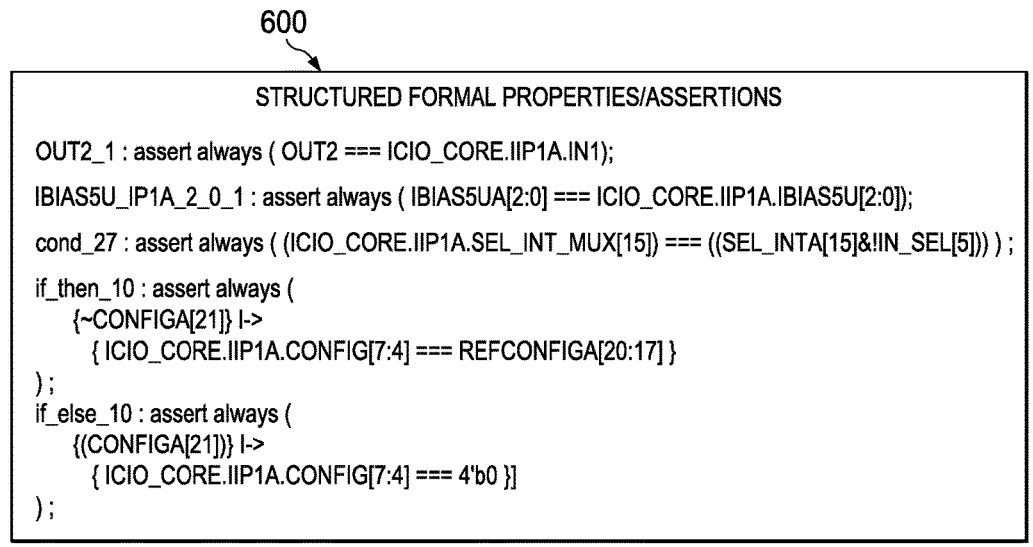
FIG. 6 shows an example formal properties file corresponding to the mixed-signal circuit design example of FIG. 2.

Referring now to FIGS. 1, 5 and 6, formal assertions are automatically generated at 104 in FIG. 1 from the executable specification file 400 to construct a formal properties file 600 shown in FIG. 6. FIG. 5 shows an example method 500 for generating the formal properties file 600 which can be employed at 104 in one implementation of the integration verification method 100 of FIG. 1. The executable specification file 400 in one example is parsed and analyzed at 104 using processor-executed software (not shown) for any errors by comparing with the mixed-signal modules Verilog netlist. Formal properties are then generated based on the integration type (e.g., conditional, if/else and assign). At 502 in FIG. 5, the processor processes the first two lines of the executable specification file 400 to obtain the following details: (a) Position of the port details, logic details, comment and analog circuit block (IP) details, (b) all Analog IP names, and (c) all Analog IP instance names and their full hierarchical path. At 504, the processor processes any "PRINT" abstraction captured using the $PRINT( ) construct, and stores the contents of the PRINT abstraction.

At 506, the processor processes any "IF/ELSE" abstraction captured using the $IF( ) construct 414 and determines the control condition and the assignment, determines connections for condition pass and fail cases. Once the assignment is determined, the processor ascertains the bus width of the source and the destination, compares the bus widths to make sure they are same, and if not issues a report error. The processor stores the connections determined for the "IF/ ELSE" abstraction, and repeats for any other instances.

At 508, the processor processes any "ASSIGN" abstraction capturing direct connections from port (404 in illustrated example) to individual analog circuit block ports or pins by giving the port name and module pins. The processor expands the instance substitution in the name ("\n" construct), expands multiple connections in the same instance ("/" construct), and expands buses of source and destination ("< >" construct). The processor then checks if the bus widths are the same, and reports an error if not. The processor stores the connections determined for the "ASSIGN" abstraction between the top level port and circuit block port (e.g., module pin), and repeats for any other instances.

At 510, the processor processes any "COND" abstraction that was captured in the executable specification file 400 using the $COND( ) construct 412 capturing internal connections between analog module pins and complex buses constructed from a top level port 202 to analog module pins captured using $COND( ) construct. The processor expands the instance substitution in the name ("\n" construct) and also expands multiple connections in the same instance ("/" construct). The processor further checks whether the bus width of the instance net is ONE (since control logic can be connected to a single net and not a bus), obtains the value of control in $COND( ) construct, stores the connections and controls determined for the "COND" abstraction, and repeats for any other instances.

At 512, the processor processes any "ASSIGN" abstraction captured using the $A( ) construct 411 in the specification file 400 for direct connections from a port to individual analog module pins. The processor expands the instance substitution in the name ("\n" construct), expands multiple connections in the same instance ("/" construct), expands buses of source and destination ("< >" construct), checks if the bus widths are the same, stores the connections determined for "ASSIGN" abstraction captured via the $A( ) construct 411, stores the net name and its MSB (Most Significant Bit) given in $A( ) construct, and repeats for other instances.

At 514, the processor processes any "OPEN" abstraction captured using the $OPEN( ) construct in the executable specification file 400 for open connection in the module pins. The processor expands the instance substitution in the name ("\n" construct), expands multiple connections in the same instance ("/" construct), stores the connections determined for "OPEN" abstraction captured via $OPEN( ) construct, and repeats for other instances.

At 516, the processor processes any "ASSIGN" abstraction capturing direct connections "assigned net" and individual analog module pins which were captured by giving the "assigned net" name and module pins (424). The processor expands the instance substitution in the name ("\n" construct) and expands multiple connections in the same instance ("/" construct). If a complex bus is abstracted, the processor stores the connections, and if a simple bus is abstracted ("< >" construct), the processor expands the source and destination buses. The processor checks if the bus widths are the same, and if not, reports and error. The processor then stores the connections and repeats for other instances.

At 518, the processor performs final processing to generate the formal properties file 600, such as the example shown in FIG. 6. The processor checks all module pins accounted for in the executable specification, processes respective analog modules from a corresponding Verilog file (e.g., netlist file) to get module port info, consolidates all pins for module in the executable specification file 400, compares pins in the executable specification file 400 and the corresponding Verilog file, and reports any pin mismatches. The processor generates the properties file 600 at 518 using the data stored in earlier steps in FIG. 5.

Figure 8:
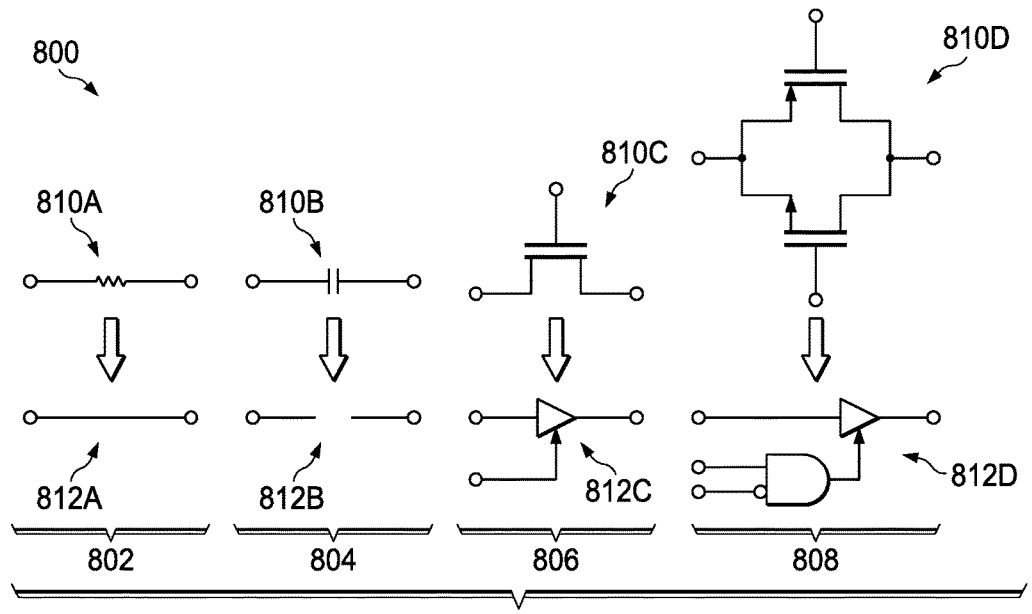

Referring now to FIGS. 1, 7 and 8, the user in one example manually models 106 one or more analog circuit components of the mixed-signal circuit design 200 at 106 in FIG. 1 as digital circuit components. FIG. 8 shows example user modelings 800 by which the user models on analog circuit component 810 as a digital circuit component 812. In one example, the user models resistor components 810A as short circuit digital components 812A via a modeling 802. A modeling 804 in FIG. 8 shows modeling of an analog capacitor 810B as an open circuit 812B. Modelings 806 and 808 provide for modeling transistor circuits 810C or 810D as tri-state buffer circuits 812C or 812D. The inventor has appreciated that components of mixed-signal integration logic often include (a) digital gates, (b) resistors 810A, (c) capacitors 810B, (d) transistors 810C and (e) pass gate switches 810D. In certain embodiments of the present disclosure, the user respectively models these as (a) RTL (Register Transfer Level) model, (b) wire, (c) open circuits and (d, e) tristate buffers with appropriate control logic in a model file 700. In certain examples, the model file 700 includes one or more model file sections or components implemented in Verilog language, such as 702 (resistor model), 704 (capacitor model), NMOS transistor model 706A (RTL transistor model), PMOS transistor model (706B), and a model component 708 (pass gate switch model). In this manner, the modeling process at 106 includes manually replacing a resistor 810A of the mixed-signal circuit design 200 with a short circuit 812A in the model file 700, and/or replacing a capacitor 810B of the mixed-signal circuit design 200 with an open circuit 812B in the model file 700, and/or replacing a transistor circuit 810C, 810D of the mixed-signal circuit design 200 with a tristate buffer circuit 812C, 812D in the model file 700. As shown in FIG. 8, the processing 106 may include replacing a transistor 810C of the mixed-signal circuit design 200 with a tristate buffer circuit 812C in the model file, and/or or replacing a pass gate circuit 810D with a logic controlled tristate buffer circuit 812D in the model file. With these abstracted models in a model file 700, the netlist can have combinatorial loops formed due to resistors/transistors being transformed as combinational logic. These loops can be broken by updating the netlist or by use of an EDA tool to break the same.

Figure 9:
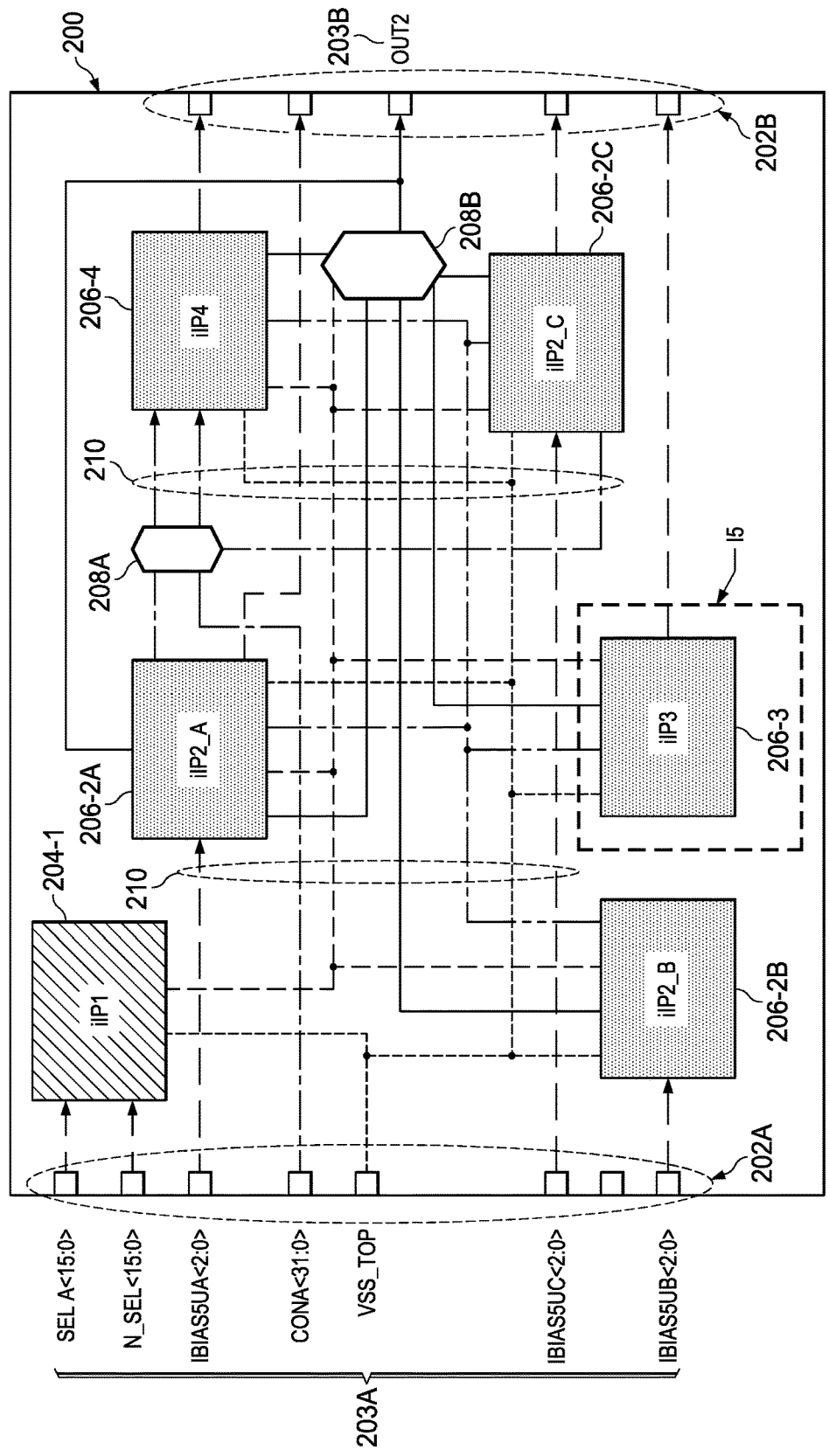
FIG. 9 is a schematic diagram showing black box modeling in the example mixed-signal circuit design of FIG. 2 in the integration verification method of FIG. 1.

Referring now to FIGS. 1 and 9, examples of the method 100 further include modeling one or more analog circuit blocks 206 of the design 200 at 108 as one or more ports in the model file. This effectively allows the subsequent formal verification to treat the modeled circuit blocks 206 as "black boxes" in order to focus the automated formal verification processing (e.g., using EDA tools) on integration verification. The inventor has appreciated that larger analog components are generally not a part of the integration logic and hence we can be modeled as black boxes. The black box modeling at 108 also helps in (a) reducing the runtime analysis, (b) focusing on coverage of the critical sections and (c) preventing false errors being identified in the later steps (e.g., reduces false negatives). In the example of FIG. 9, the user manually designates certain analog circuit blocks 206-2A, 206-2B, 206-2C, 206-3 and 206-4 in FIG. 9 to be modeled as ports (e.g., black boxed) for formal verification of the mixed-signal circuit design 200.

Referring also to FIG. 10, formal methods are then used at 110 in FIG. 1 to prove the generated properties represented by the initial netlist or other file defining the initial integration intent, the formal properties file 600 (FIG. 6) and any model files 700 created at 106 and/or 108. In certain examples, this includes using a processor executing an EDA tool (not shown) to generate a coverage report file 1000 shown in FIG. 10. If the properties fail, they are then debugged and appropriate actions are taken. At 112, the tool generates the coverage report file 1000 for analysis by the user. The generated coverage file 1000 indicates coverage for the pins of the analog modules (circuit block ports) and ports 202 at the top level and logic 204 and 208 in between. The coverage report 1000 provides integration and connection coverage, and the user analyzes the coverage data at 112 to ensure comprehensive verification of the mixed-signal integration.

The disclosed methods 100, 300 and 500 facilitate mixed-signal analog and digital circuit design verification that focuses the verification processing on the integration intent for a particular design 200. This, in turn, facilitates significant reduction in verification time using EDA tools compared with conventional simulation techniques. For example, a complex mixed-signal I/O circuit design having 26 analog circuit blocks (analog IPs), 2700 IO Ports, 13,000 internal connections and 120 complex control logic conditions (with at least 10 literals in each condition) for a design having approximately 15% analog circuitry and 85% digital circuitry has an estimated comprehensive verification using traditional simulation over approximately 30 days. Such a design was verified using the above-described techniques, including generation of 1099 properties in a formal properties file 600 for all connections and conditional logic, black box modeling of 26 instances of eight analog circuit blocks (analog IPs), with a runtime of approximately 10 minutes, representing a 5000× improvement for the same quality over simulation. In one example, iterations for new netlist can take approximately half a day depending on design complexity, and the verification identified actual design bugs related to control bus expansion. 60 additional functional simulations were used to verify dependency and functional operation, for example resistor value programmability, analog program metrics, sequencing the, etc. The disclosed techniques can be advantageously employed to facilitate comprehensive integration verification and coverage analysis of mixed-signal integration.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A method to verify integration of a mixed-signal circuit design, the method comprising:
   generating an executable specification file including a plurality of integration abstractions that represent an intended integration of ports and digital circuit blocks of the mixed-signal design;
   automatically generating a formal properties file from the executable specification file using a processor executing a software program;
   modeling an analog circuit component of the mixed-signal circuit design as a digital circuit component in a model file;
   modeling at least one analog circuit block of the mixed-signal circuit design as one or more ports in the model file; and
   verifying correspondence of connections and integration of the formal properties file and the model file with the mixed-signal circuit design using a processor executing an electronic design automation (EDA) tool to generate a coverage report file,
   wherein generating the executable specification file includes at least one of:
   adding a first construct to the executable specification file to represent internal direct connections of the mixed-signal design;
   adding a second construct and at least one logic expression to the executable specification file to represent a mixed-signal control logic circuit block of the mixed-signal design;
   adding a third construct to the executable specification file to represent unconnected external ports of the mixed-signal circuit design; or
   adding a fourth construct to the executable specification file to represent a switched connection of the mixed-signal design.

2. The method of claim 1, further comprising:
   analyzing the coverage report file to determine an amount of coverage of the mixed-signal circuit design verification.

3. The method of claim 1, wherein the mixed-signal design is represented as a netlist file, and wherein the executable specification file is generated according to the netlist file.

4. The method of claim 3, wherein verifying correspondence of the connections and integration of the formal properties file with the mixed-signal circuit design comprises comparing the connections of the netlist file with the formal properties file and the model file.

5. The method of claim 1, wherein generating the executable specification file further includes adding a fifth construct to the executable specification file to represent elements of the mixed-signal design that cannot be represented by any of the first, second, third or fourth constructs.

6. The method of claim 5, wherein generating the executable specification file further includes at least one of:
   adding a sixth construct to the executable specification file to represent multiple connections to a single port, or multiple connections to a single circuit block of the mixed-signal circuit design;
   adding a seventh construct to the executable specification file to represent a normal bus of the mixed-signal design;
   adding an eighth construct to the executable specification file to represent a complex bus of the mixed-signal design; or
   adding a ninth construct to the executable specification file to represent whole connection of the mixed-signal design.

7. The method of claim 5, wherein modeling the analog circuit component of the mixed-signal circuit design as a digital circuit component includes at least one of:
   replacing a resistor of the mixed-signal circuit design with a short circuit in the model file;
   replacing a capacitor of the mixed-signal circuit design with an open circuit in the model file; or
   replacing a transistor circuit of the mixed-signal circuit design with a tristate buffer circuit in the model file.

8. The method of claim 1, wherein modeling the analog circuit component of the mixed-signal circuit design as a digital circuit component includes at least one of:
   replacing a resistor of the mixed-signal circuit design with a short circuit in the model file;

replacing a capacitor of the mixed-signal circuit design with an open circuit in the model file; or replacing a transistor circuit of the mixed-signal circuit design with a tristate buffer circuit in the model file.

9. The method of claim 1, wherein modeling the analog circuit component of the mixed-signal circuit design as a digital circuit component includes at least one of:

replacing a resistor of the mixed-signal circuit design with a short circuit in the model file;

replacing a capacitor of the mixed-signal circuit design with an open circuit in the model file; or replacing a transistor circuit of the mixed-signal circuit design with a tristate buffer circuit in the model file.

10. The method of claim 9, wherein replacing the transistor circuit of the mixed-signal circuit design with a tristate buffer circuit further includes at least one of:

replacing a transistor of the mixed-signal circuit design with a tristate buffer circuit in the model file); or replacing a pass gate circuit of the mixed-signal circuit design with a logic controlled tristate buffer circuit in the model file.

11. A method of mixed-signal design verification, comprising:

providing a netlist file representing ports, an analog circuit block and a digital circuit block of a mixed-signal circuit design; and generating an executable specification file according to the netlist file, the executable specification file including a plurality of integration abstractions that represent an intended integration of the ports and digital circuit blocks of the mixed-signal design, wherein generating the executable specification file includes at least one of:

adding a first construct to the executable specification file to represent internal direct connections of the mixed-signal design;

adding a second construct and at least one logic expression to the executable specification file to represent a mixed-signal control logic circuit block of the mixed-signal design;

adding a third construct to the executable specification file to represent unconnected external ports of the mixed-signal circuit design; or adding a fourth construct to the executable specification file to represent a switched connection of the mixed-signal design.

12. The method of claim 11, wherein generating the executable specification file includes adding a first construct to the executable specification file to represent internal direct connections of the mixed-signal design.

13. The method of claim 11, wherein generating the executable specification file includes adding a second construct and at least one logic expression to the executable specification file to represent a mixed-signal control logic circuit block of the mixed-signal design.

14. The method of claim 11, wherein generating the executable specification file includes adding a third construct to the executable specification file to represent unconnected external ports of the mixed-signal circuit design.

15. The method of claim 11, wherein generating the executable specification file includes adding a fourth construct to the executable specification file to represent a switched connection of the mixed-signal design.

16. A method of verifying integration of a mixed-signal circuit design, the method comprising:

generating an executable specification file including a plurality of integration abstractions that represent an intended integration of ports and digital and/or analog circuit blocks of the mixed-signal design;

generating, using a processor executing a software program, a formal properties file representing the intended integration of ports and digital and/or analog circuit blocks of the mixed-signal design; and modeling an analog circuit component of the mixed-signal circuit design as a digital circuit component in a model file for verification using an electronic design automation (EDA) tool, wherein generating the executable specification file includes at least one of:

adding a first construct to the executable specification file to represent internal direct connections of the mixed-signal design;

adding a second construct and at least one logic expression to the executable specification file to represent a mixed-signal control logic circuit block of the mixed-signal design;

adding a third construct to the executable specification file to represent unconnected external ports of the mixed-signal circuit design; or adding a fourth construct to the executable specification file to represent a switched connection of the mixed-signal design.

17. The method of claim 16, wherein modeling the analog circuit component of the mixed-signal circuit design as a digital circuit component includes at least one of:

replacing a resistor of the mixed-signal circuit design with a short circuit in the model file;

replacing a capacitor of the mixed-signal circuit design with an open circuit in the model file; or replacing a transistor circuit of the mixed-signal circuit design with a tristate buffer circuit in the model file.

18. The method of claim 16, wherein replacing the transistor circuit of the mixed-signal circuit design with a tristate buffer circuit further includes at least one of:

replacing a transistor of the mixed-signal circuit design with a tristate buffer circuit in the model file; or replacing a pass gate circuit of the mixed-signal circuit design with a logic controlled tristate buffer circuit in the model file.

* * * * *